United States Patent [19]
Teo

[11] Patent Number: 5,895,264
[45] Date of Patent: Apr. 20, 1999

[54] METHOD FOR FORMING STACKED POLYSILICON

[75] Inventor: Yeow Meng Teo, Singapore, Singapore

[73] Assignee: Chartered Semiconductor Manufacturing Ltd., Singapore, Singapore

[21] Appl. No.: 08/902,755

[22] Filed: Jul. 30, 1997

[51] Int. Cl.[6] .................................. H01L 21/4763
[52] U.S. Cl. .................... 438/632; 438/637; 438/646; 438/672; 438/675
[58] Field of Search .................... 438/632, 626, 438/637, 646, 672, 675, FOR 493

[56] References Cited

U.S. PATENT DOCUMENTS

| | | | |
|---|---|---|---|
| 4,619,037 | 10/1986 | Taguchi et al. | 29/578 |
| 4,663,831 | 5/1987 | Birrittella et al. | 29/576 E |
| 4,696,097 | 9/1987 | McLaughlin et al. | 437/193 |
| 4,840,923 | 6/1989 | Flagello et al. | 437/189 |
| 4,977,105 | 12/1990 | Okamoto et al. | 437/190 |
| 5,155,056 | 10/1992 | Jeong-Gyoo | 437/47 |
| 5,262,352 | 11/1993 | Woo et al. | 437/189 |
| 5,432,129 | 7/1995 | Hodges | 437/200 |
| 5,439,848 | 8/1995 | Hsu et al. | 437/195 |

Primary Examiner—John F. Niebling
Assistant Examiner—David A. Zarneke
Attorney, Agent, or Firm—George O. Saile; Stephen B. Ackerman

[57] ABSTRACT

An improved and new method for forming stacked polysilicon contacts for use in multilevel conducting interconnection wiring in semiconductor integrated circuits has been developed. The polysilicon contacts are self-aligned between wiring levels and the fabrication process results in a substantially planar top insulating layer surface.

40 Claims, 4 Drawing Sheets

FIG. 8

METHOD FOR FORMING STACKED POLYSILICON

BACKGROUND OF THE INVENTION (1) Field of the Invention

This invention relates to a method of fabrication used for semiconductor integrated circuit devices, and more specifically to an improved process for forming stacked polysilicon contacts.

(2) Description of Related Art

The complexity of present-day integrated circuits requires multiple layers of interconnection conductive patterns in order to connect the discrete semiconductor devices into integrated circuits. In order to minimize use of lateral area over the semiconductor chip surface it is desirable to stack connecting vias directly over one another when connections are made between multiple layers of interconnection conductive patterns. However, in conventional via processing allocation must be made for possible mask misalignment between the conductive interconnection patterns of successive interconnection layers and the etched through hole patterns of successive insulating layers. As a result design rules require that interconnect vias have larger than necessary diameters to assure that they will overlap with conductive lines above and below them with sufficient area to meet designed current carrying requirements. Also, spacings between laterally adjacent interconnection lines have to be enlarged in the region of the interconnect vias in order to avoid undesired shorts.

In conventional processes for formation of the multilevel interconnection structure each via between successive interconnection layers is formed by separate lithographic and etching steps. Each additional lithographic step and each via etch step are costly and add to the complexity of the manufacturing process.

Numerous improvements to methods of forming stacked vias have been invented. For example, U.S. Pat. No. 5,155, 056 entitled "Process for Formation of Cells Having Self-Aligned Capacitor Contacts, and Structure Thereof" granted Oct. 13, 1992 to Kim Jeong-Gyoo describes a method of forming self-aligned capacitor contacts, wherein polysilicon layers of differing conductivity types are used.

Also, U.S. Pat. No. 5,432,129 entitled "Method of Forming Low Resistance Contacts At the Junction Between Regions Having Different Conductivity Types" granted Jul. 11, 1995 to Robert L. Hodges describes a method for forming low resistance contacts between polysilicon layers of different conductivity types. The contact resistance is reduced by forming titanium disilicide or other refractory metal suicides at the contact region.

And, U.S. Pat. No. 5,439,848 entitled "Method for Fabricating a Self-Aligned Multi-Level Interconnect" granted Aug. 8, 1995 to Sheng T. Hsu et al describes a method of forming self-aligned multilevel interconnects in which a hole in the top insulator layer defines a succession of self-aligned subsequent holes through underlying conductors and insulating layers.

SUMMARY OF THE INVENTION

One object of the present invention is to provide an improved method of fabricating stacked polysilicon contacts in multilevel conducting interconnection patterns for semiconductor integrated circuits.

Another object of the present invention is to provide a new and improved process for fabricating stacked polysilicon contacts in multilevel conducting interconnection patterns for semiconductor integrated circuits where the stacked polysilicon contacts are self-aligned.

A further object of the present invention is to provide a new and improved process for fabricating stacked polysilicon contacts in multilevel conducting interconnection patterns where recessed contacts are fabricated between successive conducting patterns and subsequently insulated and planarized through the use of a heat treatment which causes reflow of the top insulating layer in a multilevel structure.

In accordance with the present invention, the above and other objectives are realized by using a method of forming an integrated circuit interconnection structure on a semiconductor substrate containing device regions, comprising the steps of: providing said semiconductor substrate containing device regions; forming a first plurality of spaced-apart insulating layers, including a top insulating layer on said semiconductor substrate containing device regions; forming a second plurality of spaced-apart conducting layers and positioning them interdigitally relative to said insulating layers; defining a first hole extending through the top insulating layer; using the first hole for defining a succession of self-aligned subsequent holes through the underlying conducting layers and underlying insulating layers, each successive hole being continuous with and self-aligned to one above it, and exposing a plurality of underlying device regions in the semiconductor substrate; depositing a through conductor layer onto the surface of the top insulating layer and into the first hole extending through the top insulating layer and into the succession of self-aligned subsequent holes through the underlying conducting layers and underlying insulating layers; blanket etching of the through conductor layer to remove the through conductor layer from the surface of the top insulating layer; continuing the blanket etching of the through conductor layer remaining in the first hole extending through the top insulating layer until the top of the conductor layer remaining in said first hole is at a level coincident with the level of the topmost underlying conducting layer, thus producing a recessed conducting via between the underlying conducting layers and the underlying device region in the semiconductor substrate; and heat treating the structure to cause reflow of the top insulating layer to cover the top of said recessed conducting via with a reflowed top insulating layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method for fabricating stacked polysilicon contacts in multilevel conducting interconnection patterns for semiconductor integrated circuits will now be described in detail.

Figure 1:
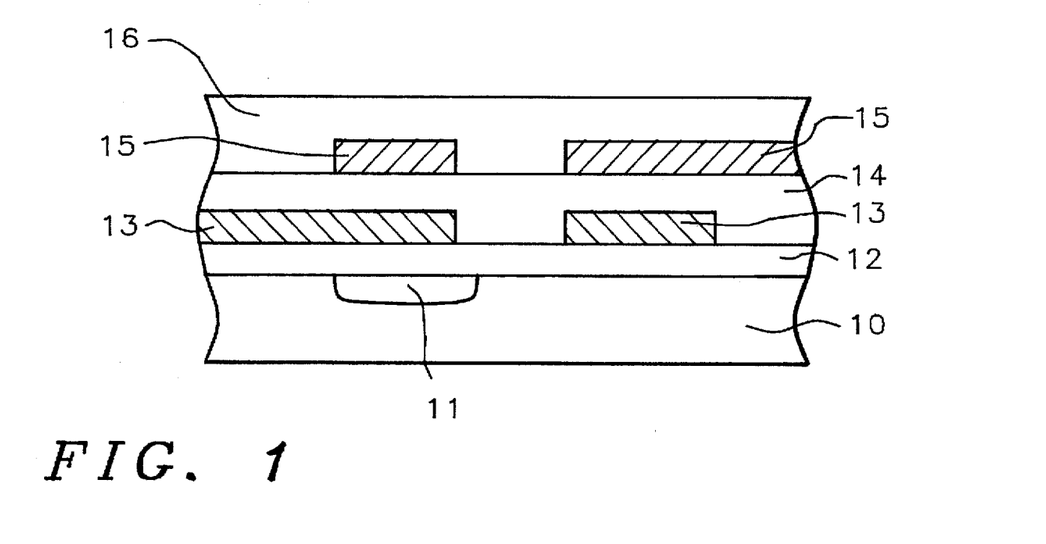
FIGS. 1–6, which schematically, in cross-sectional representation, illustrate the method of one embodiment of the present invention.

Referring to FIG. 1, a semiconductor substrate 10 has therein a plurality of device regions, here illustrated for simplicity as a single device region 11. Formed on the surface of the semiconductor substrate 10 are a plurality of alternating insulating layers and conducting layer patterns, as illustrated. Layer 12 is an insulating layer; for example, a gate oxide comprising silicon oxide having a thickness between about 100 and 300 Angstroms. Layer 13 is a patterned conducting layer, such as doped polysilicon having a thickness of between about 2000 and 6000 Angstroms. Layer 14 is an insulating layer, such as silicon oxide having a thickness between about 2000 and 6000 Angstroms. Layer 15 is a second patterned conducting layer, such as doped polysilicon having a thickness between about 2000 and 6000 Angstroms. Additional alternating insulating layers and patterned conducting layers may be stacked on the semiconductor substrate to provide additional levels of interconnection wiring as may be required by the complexity of the integrated circuits. Layer 16, the top insulating layer, is silicon oxide having a thickness between about 6000 and 10,000 Angstroms. Layer 16 may be deposited by CVD (Chemical Vapor Deposition) processes using TEOS (tetraethylorthosilicate) and dopants TMP (trimethylphosphate), TEP (triethylphosphate), TMB (trimethylborate), and TEB (triethylborate).

Figure 2:
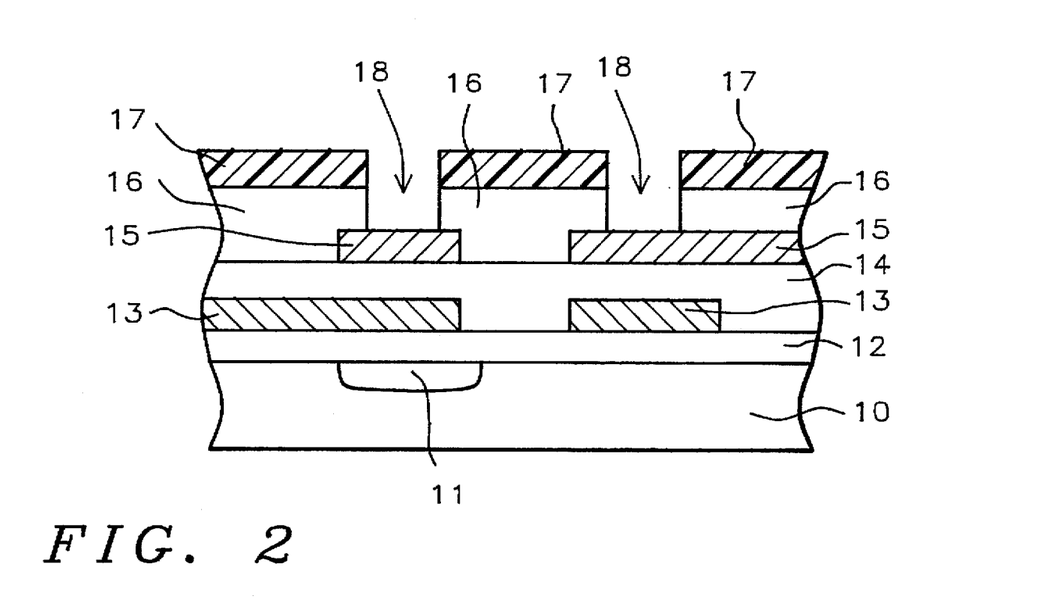
Figure 3:
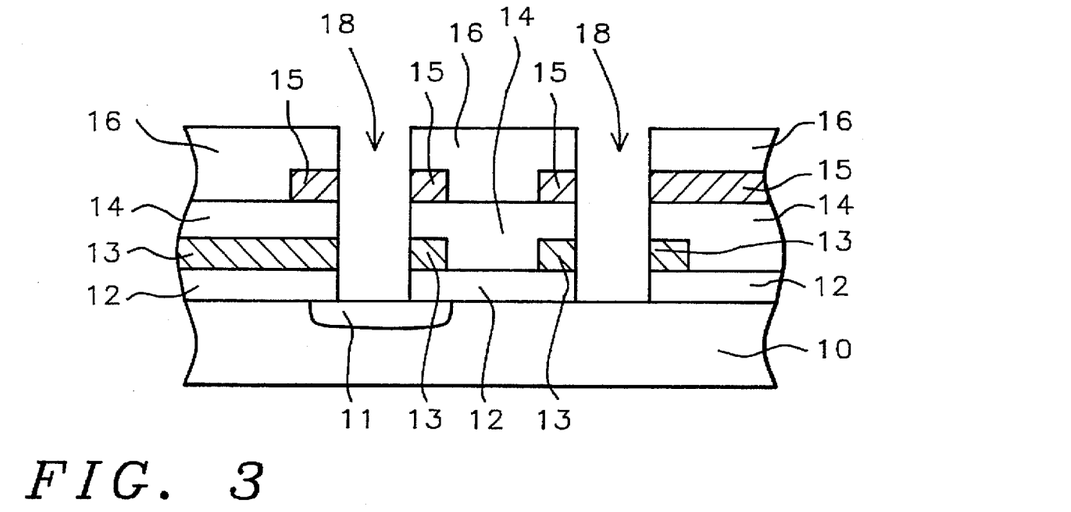

Now referring to FIG. 2, a patterned photoresist masking layer 17 is formed on the surface of insulating layer 16 and a plasma etching process using $CF_4$, $CHF_3$ and argon etchant gases is used to etch a hole in layer 16, stopping on conducting layer 15. The patterned photoresist mask 17 is then removed using a suitable organic solvent or an oxygen plasma ashing process. Next, referring to FIG. 3, the holes 18 in layer 16 are used to define the position of further etching of holes through underlying conducting layers 15 and 13 and underlying insulating layers 14 and 12. Each successive hole through a layer is self-aligned to the one above it and etching is continued until the device region 11 is exposed. Etching of patterned conducting layers 15 and 13, such as patterned doped polysilicon layers, may be by plasma etch processes using $Cl_2$ and HBr etchant gases. Etching of insulating layers 14 and 12, such as silicon oxide, may be by plasma etch processes using $CF_4$, $CHF_3$ and argon etchant gases.

Figure 4:
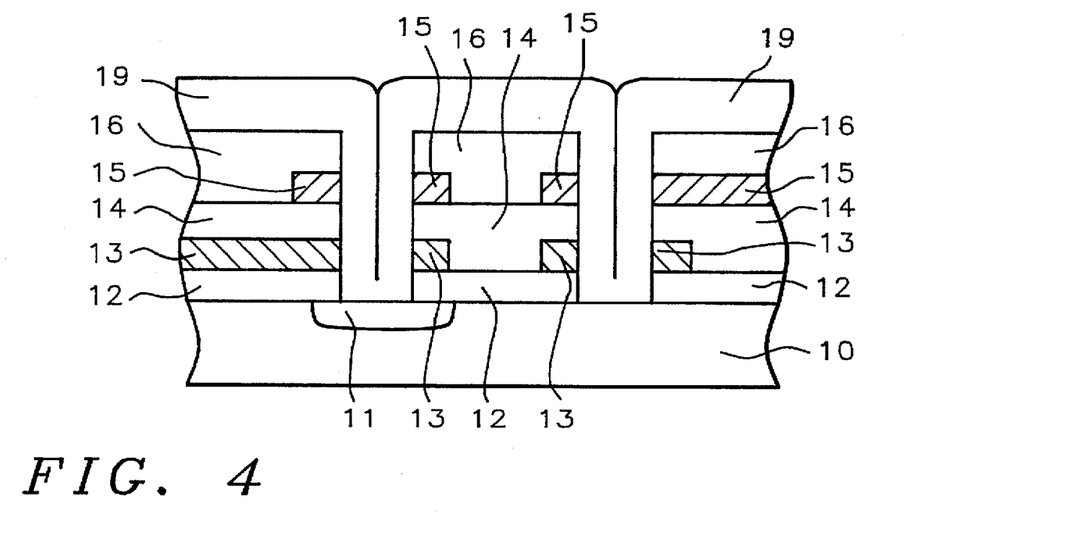
Figure 5:
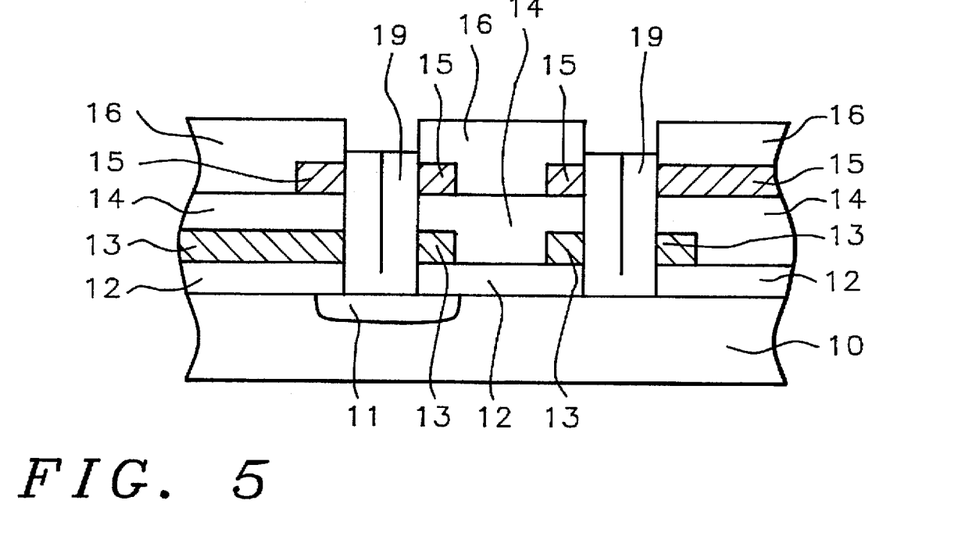

As shown in FIG. 4, a conducting layer 19 is deposited onto the surface of the top insulating layer 16 and into the first holes 18 extending through the top insulating layer 16 and into the succession of self-aligned subsequent holes through the underlying patterned conducting layers 15 and 13 and underlying insulating layers 14 and 12. Conducting layer 19 may be doped polysilicon deposited by CVD (Chemical Vapor Deposition) processes using $SiH_4$ or $SiCl_2H_2$ and $PH_3$ to a thickness between about 2000 and 6000 Angstroms. Now referring to FIG. 5, blanket etching is used to remove conducting layer 19 from the surface of layer 16 and the blanket etching is continued to remove conducting layer 19 remaining in the hole extending through the top insulating layer 16 until the top of the conducting layer 19 remaining in the hole is at a level coincident with the level of the topmost underlying conducting layer 15, thus producing a recessed conducting via between the underlying conducting layers 15 and 13 and the underlying device region 11 in the semiconductor substrate 10.

Figure 6:
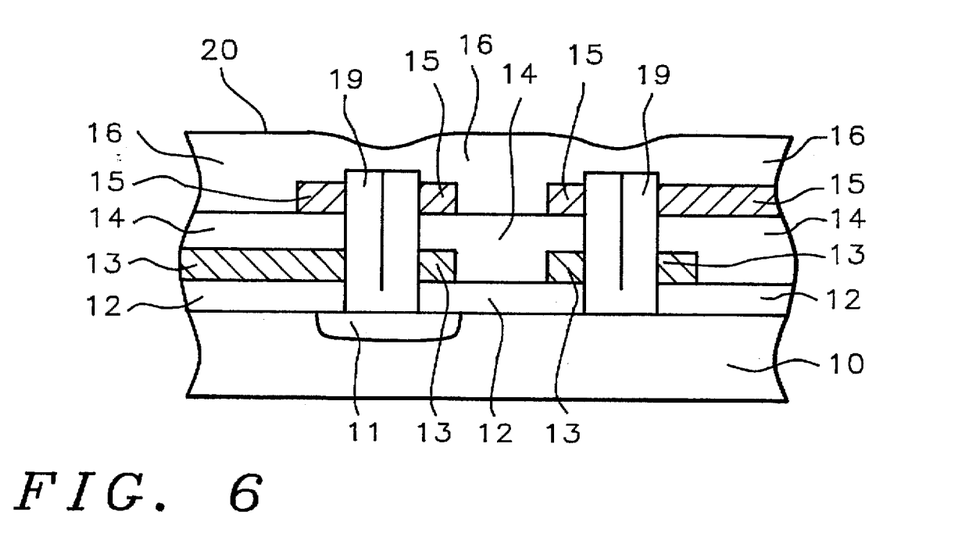

Referring to FIG. 6, the etched structure is heat treated to cause reflow of the top insulating layer 16 to cover the top of the recessed conducting via with a reflowed top insulating layer. The heat treatment may comprise RTA (Rapid Thermal Anneal) at a temperature between about 900 and 1000° C. for a time between about 20 and 60 sec. Alternately the heat treatment may comprise an oven bake at a temperature between about 800 and 900° C. for a time between about 10 and 30 min. The heat treatment causes reflow of the top insulating layer into the etched hole 18 and the reflowed insulating layer covers the top of the recessed conducting via producing a substantially planar surface 20 on the structure.

Figure 7:
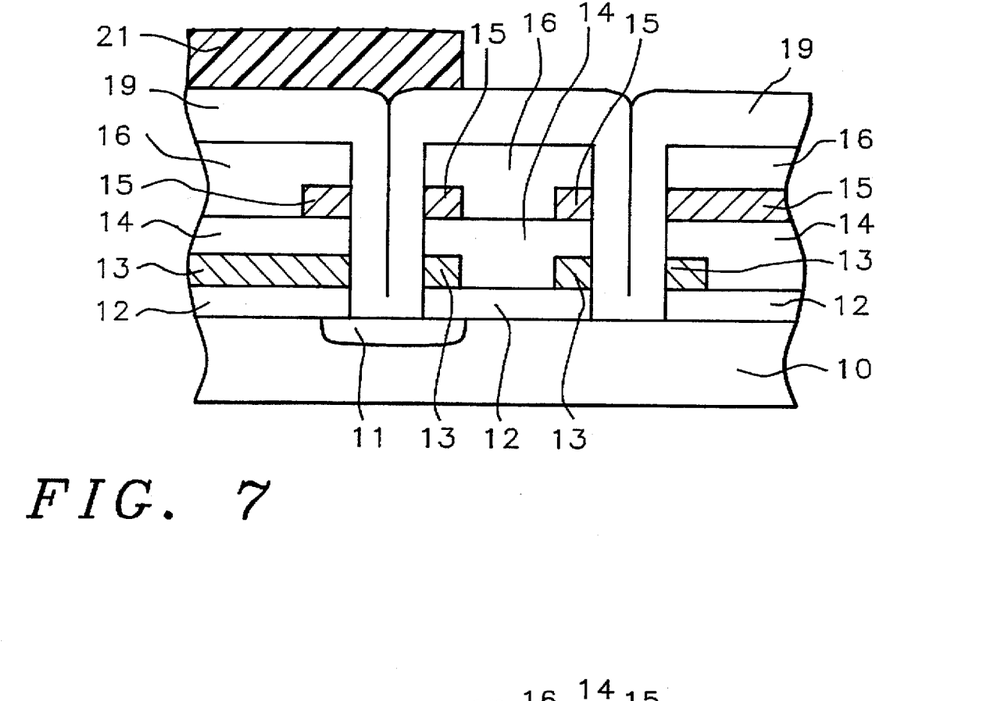
FIGS. 7–8, which schematically in cross-sectional representation, illustrate the method of a second embodiment of the present invention.
Figure 8:
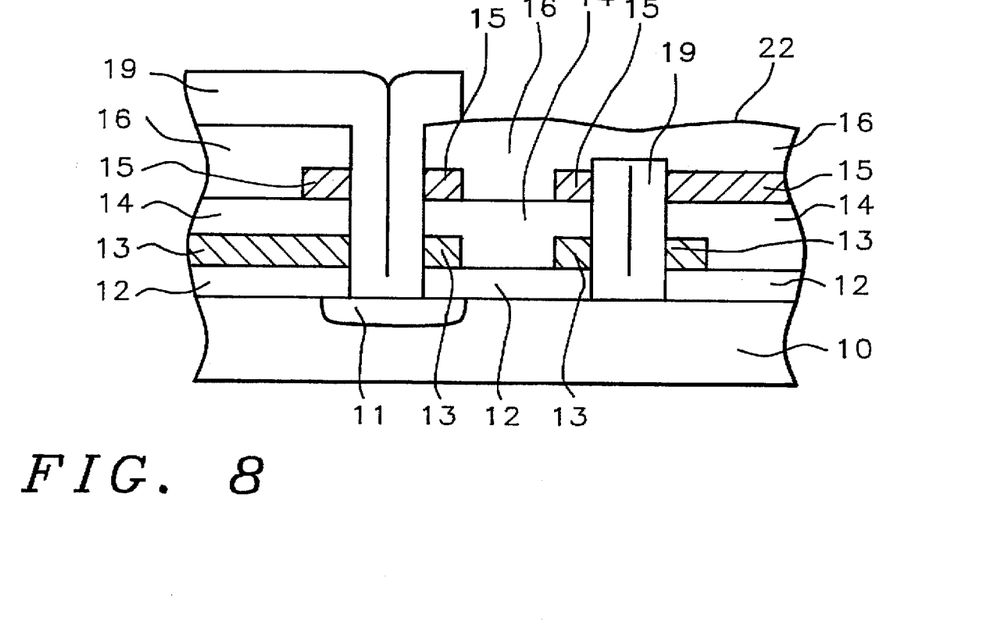

In a second embodiment of the invention, after deposition of the conducting layer 19 the conducting layer 19 is patterned and etched to form an interconnection wiring pattern on the surface of the top insulating layer 16, as shown in FIGS. 7 and 8. A patterned photoresist mask 21 is formed over the conducting layer 19 and plasma etching is used to remove the unmasked conductor layer from the surface of the top insulating layer 16. The plasma etching is continued to remove unmasked conducting layer 19 remaining in unmasked holes extending through the top insulating layer until the top of the conductor layer remaining in the unmasked hole is at a level coincident with the level of the topmost underlying conducting layer 15, thus producing a recessed conducting via between the underlying conducting layers 15 and 13. A conducting via is, also, formed between patterned conducting layer 19, underlying conducting layers 15 and 13, and device region 11. Following the etching processes the photoresist mask 21 is removed and the etched structure is heat treated to cause reflow of the top insulating layer 16 to cover the top of said recessed conducting via with a reflowed top insulating layer, as shown in FIG. 8. The heat treatment may comprise RTA (Rapid Thermal Anneal) at a temperature between about 900 and 1000° C. for a time between about 20 and 60 sec. Alternately the heat treatment may comprise an oven bake at a temperature between about 800 and 900° C. for a time between about 10 and 30 min. The heat treatment causes reflow of the top insulating layer into the etched hole 18 and the reflowed insulating layer covers the top of the recessed conducting via producing a substantially planar top insulating layer surface 22 on the structure.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an integrated circuit interconnection structure on a semiconductor substrate containing device regions, comprising the steps of:

providing said semiconductor substrate containing device regions;

forming a first plurality of spaced-apart insulating layers, including a top insulating layer on said semiconductor substrate containing device regions;

forming a second plurality of spaced-apart conducting layers and positioning them interdigitally relative to said insulating layers;

defining a first hole extending through the top insulating layer;

using the first hole for defining a succession of self-aligned subsequent holes through the underlying conducting layers and underlying insulating layers, each successive hole being continuous with and self-aligned to one above it, and exposing a plurality of underlying device regions in the semiconductor substrate;

depositing a through conductor layer onto the surface of the top insulating layer and into the first hole extending through the top insulating layer and into the succession of self-aligned subsequent holes through the underlying conducting layers and underlying insulating layers;

blanket etching of the through conductor layer to remove the through conductor layer from the surface of the top insulating layer;

continuing the blanket etching of the through conductor layer remaining in the first hole extending through the top insulating layer until the top of the conductor layer remaining in said first hole is at a level coincident with the level of the topmost underlying conducting layer, thus producing a recessed conducting via between the underlying conducting layers and the underlying device region in the semiconductor substrate; and heat treating the structure to cause reflow of the top insulating layer to cover the top of said recessed conducting via with a reflowed top insulating layer.

2. The method of claim 1, wherein said second plurality of spaced-apart conducting layers comprises polysilicon layers having thicknesses between about 2000 and 6000 Angstroms.

3. The method of claim 1, wherein the second plurality of spaced-apart conducting layers comprises at least two spaced-apart conducting layers.

4. The method of claim 1, wherein said first plurality of spaced-apart insulating layers comprises silicon oxide layers having thicknesses between about 2000 and 6000 Angstroms.

5. The method of claim 1, wherein said through conductor layer comprises doped polysilicon deposited by CVD processes using $SiH_4$ or $SiCl_2H_2$ and $PH_3$ to a thickness between about 2000 and 6000 Angstroms.

6. The method of claim 1, wherein said blanket etching of the through conductor layer is a plasma etching process.

7. The method of claim 5, wherein said blanket etching of said doped polysilicon is a plasma etching process using $Cl_2$ and HBr as etchant gases.

8. The method of claim 1, wherein said heat treating comprises RTA (Rapid Thermal Anneal) at a temperature between about 900 and 1000° C. for a time between about 20 and 60 sec.

9. The method of claim 1, wherein said heat treating comprises an oven bake at a temperature between about 800 and 900° C. for a time between about 10 and 30 min.

10. The method of claim 1, wherein said top insulating layer comprises silicon oxide deposited by CVD processes using TEOS (tetraethylorthosilicate) and dopants TMP (trimethylphosphate), TEP (triethylphosphate), TMB (trimethylborate, and TEB (triethylborate), to a thickness between about 6000 and 10,000 Angstroms.

11. A method of fabrication of an integrated circuit interconnection structure on a semiconductor substrate containing device regions, comprising the steps of:

providing said semiconductor substrate containing device regions;

forming a first plurality of spaced-apart insulating layers, including a top insulating layer on said semiconductor substrate containing device regions;

forming a second plurality of spaced-apart conducting layers and positioning them interdigitally relative to said insulating layers;

defining a first hole extending through the top insulating layer;

using the first hole for defining a succession of self-aligned subsequent holes through the underlying conducting layers and underlying insulating layers, each successive hole being continuous with and self-aligned to one above it, and exposing a plurality of underlying device regions in the semiconductor substrate;

depositing a through conductor layer onto the surface of the top insulating layer and into the first hole extending through the top insulating layer and into the succession of self-aligned subsequent holes through the underlying conducting layers and underlying insulating layers;

forming a masking pattern layer over said through conductor layer;

etching of the unmasked through conductor layer to remove the unmasked through conductor layer from the surface of the top insulating layer;

continuing the etching of the unmasked through conductor layer remaining in the first hole extending through the top insulating layer until the top of the conductor layer remaining in said first hole is at a level coincident with the level of the topmost underlying conducting layer, thus producing a recessed conducting via between the underlying conducting layers and the underlying device region in the semiconductor substrate and a patterned through conductor layer on the surface of the top insulating layer;

removing the masking pattern layer; and heat treating the structure to cause reflow of the top insulating layer to cover the top of said recessed conducting via with a reflowed top insulating layer.

12. The method of claim 11, wherein said second plurality of spaced-apart conducting layers comprises polysilicon layers having thicknesses between about 2000 and 6000 Angstroms.

13. The method of claim 11, wherein the second plurality of spaced-apart conducting layers comprises at least two spaced-apart conducting layers.

14. The method of claim 11, wherein said first plurality of spaced-apart insulating layers comprises silicon oxide layers having thicknesses between about 2000 and 6000 Angstroms.

15. The method of claim 11, wherein said through conductor layer comprises doped polysilicon deposited by CVD processes using $SiH_4$ or $SiCl_2H_2$ and $PH_3$ to a thickness between about 2000 and 6000 Angstroms.

16. The method of claim 11, wherein said etching of the unmasked through conductor layer is a plasma etching process.

17. The method of claim 15, wherein said etching of said unmasked doped polysilicon is a plasma etching process using $Cl_2$ and HBr as etchant gases.

18. The method of claim 11, wherein said heat treating comprises RTA (Rapid Thermal Anneal) at a temperature between about 900 and 1000° C. for a time between about 20 and 60 sec.

19. The method of claim 11, wherein said heat treating comprises an oven bake at a temperature between about 800 and 900° C. for a time between about 10 and 30 min.

20. The method of claim 11, wherein said top insulating layer comprises silicon oxide deposited by CVD processes using TEOS (tetraethylorthosilicate) and dopants TMP (trimethylphosphate), TEP (triethylphosphate), TMB (trimethylborate, and TEB (triethylborate), to a thickness between about 6000 and 10,000 Angstroms.

21. A method of fabrication of an integrated circuit interconnection structure on a semiconductor substrate containing device regions, comprising the steps of:

providing said semiconductor substrate containing device regions;

forming a first plurality of spaced-apart insulating layers, including a top insulating layer on said semiconductor substrate containing device regions;

forming a second plurality of spaced-apart conducting layers and positioning them interdigitally relative to said insulating layers;

forming a first photoresist masking pattern on the surface of said top insulating layer;

etching a first hole extending through the top insulating layer stopping on the first underlying conducting layer;

removing said first photoresist masking pattern;

using the first hole for defining a succession of self-aligned subsequent holes through the underlying conducting layers and underlying insulating layers, each successive hole being continuous with and self-aligned to one above it, and exposing a plurality of underlying device regions in the semiconductor substrate;

depositing a through conductor layer onto the surface of the top insulating layer and into the first hole extending through the top insulating layer and into the succession of self-aligned subsequent holes through the underlying conducting layers and underlying insulating layers;

blanket etching of the through conductor layer to remove the through conductor layer from the surface of the top insulating layer;

continuing the blanket etching of the through conductor layer remaining in the first hole extending through the top insulating layer until the top of the conductor layer remaining in said first hole is at a level coincident with the level of the topmost underlying conducting layer, thus producing a recessed conducting via between the underlying conducting layers and the underlying device region in the semiconductor substrate; and heat treating the structure to cause reflow of the top insulating layer to cover the top of said recessed conducting via with a reflowed top insulating layer.

22. The method of claim 21, wherein said second plurality of spaced-apart conducting layers comprises doped polysilicon layers having thicknesses between about 2000 and 6000 Angstroms.

23. The method of claim 21, wherein the second plurality of spaced-apart conducting layers comprises at least two spaced-apart conducting layers.

24. The method of claim 21, wherein said first plurality of spaced-apart insulating layers comprises silicon oxide layers having thicknesses between about 2000 and 6000 Angstroms.

25. The method of claim 21, wherein said through conductor layer comprises polysilicon deposited by CVD processes using $SiH_4$ or $SiCl_2H_2$ and $PH_3$ to a thickness between about 2000 and 6000 Angstroms.

26. The method of claim 21, wherein said blanket etching of the through conductor layer is a plasma etching process.

27. The method of claim 25, wherein said blanket etching of said doped polysilicon is a plasma etching process using $Cl_2$ and $HBr$ as etchant gases.

28. The method of claim 21, wherein said heat treating comprises RTA (Rapid Thermal Anneal) at a temperature between about 900 and 1000° C. for a time between about 20 and 60 sec.

29. The method of claim 21, wherein said heat treating comprises an oven bake at a temperature between about 800 and 900° C. for a time between about 10 and 30 min.

30. The method of claim 21, wherein said top insulating layer comprises silicon oxide deposited by CVD processes using TEOS (tetraethylorthosilicate) and dopants TMP (trimethylphosphate), TEP (triethylphosphate), TMB (trimethylborate, and TEB (triethylborate), to a thickness between about 6000 and 10,000 Angstroms.

31. A method of fabrication of an integrated circuit interconnection structure on a semiconductor substrate containing device regions, comprising the steps of:

providing said semiconductor substrate containing device regions;

forming a first plurality of spaced-apart insulating layers, including a top insulating layer on said semiconductor substrate containing device regions;

forming a second plurality of spaced-apart conducting layers and positioning them interdigitally relative to said insulating layers;

forming a first photoresist masking pattern on the surface of said top insulating layer;

etching a first hole extending through the top insulating layer stopping on the first underlying conducting layer;

removing said first photoresist masking pattern;

using the first hole for defining a succession of self-aligned subsequent holes through the underlying conducting layers and underlying insulating layers, each successive hole being continuous with and self-aligned to one above it, and exposing a plurality of underlying device regions in the semiconductor substrate;

depositing a through conductor layer onto the surface of the top insulating layer and into the first hole extending through the top insulating layer and into the succession of self-aligned subsequent holes through the underlying conducting layers and underlying insulating layers;

forming a second masking pattern layer over said through conductor layer;

etching of the unmasked through conductor layer to remove the unmasked through conductor layer from the surface of the top insulating layer;

continuing the etching of the unmasked through conductor layer remaining in the first hole extending through the top insulating layer until the top of the conductor layer remaining in said first hole is at a level coincident with the level of the topmost underlying conducting layer, thus producing a recessed conducting via between the underlying conducting layers and the underlying device region in the semiconductor substrate and a patterned through conductor layer on the surface of the top insulating layer;

removing said second masking pattern layer; and heat treating the structure to cause reflow of the top insulating layer to cover the top of said recessed conducting via with a reflowed top insulating layer.

32. The method of claim 31, wherein said second plurality of spaced-apart conducting layers comprises doped polysilicon layers having thicknesses between about 2000 and 6000 Angstroms.

33. The method of claim 31, wherein the second plurality of spaced-apart conducting layers comprises at least two spaced-apart conducting layers.

34. The method of claim 31, wherein said first plurality of spaced-apart insulating layers comprises silicon oxide layers having thicknesses between about 2000 and 6000 Angstroms.

35. The method of claim 31, wherein said through conductor layer comprises doped polysilicon deposited by CVD processes using $SiH_4$ or $SiCl_2H_2$ and $PH_3$ to a thickness between about 2000 and 6000 Angstroms.

36. The method of claim 31, wherein said etching of the unmasked through conductor layer is a plasma etching process.

37. The method of claim 35, wherein said etching of said unmasked doped polysilicon is a plasma etching process using $Cl_2$ and HBr as etchant gases.

38. The method of claim 31, wherein said heat treating comprises RTA (Rapid Thermal Anneal) at a temperature between about 900 and 1000° C. for a time between about 20 and 60 sec.

39. The method of claim 31, wherein said heat treating comprises an oven bake at a temperature between about 800 and 900° C. for a time between about 10 and 30 min.

40. The method of claim 31, wherein said top insulating layer comprises silicon oxide deposited by CVD processes using TEOS (tetraethylorthosilicate) and dopants TMP (trimethylphosphate), TEP (triethylphosphate), TMB (trimethylborate, and TEB (triethylborate), to a thickness between about 6000 and 10,000 Angstroms.

\* \* \* \* \*

UNITED STATES PATENT AND TRADEMARK OFFICE
CERTIFICATE OF CORRECTION

PATENT NO. : 5,895,264  
DATED : April 20, 1999  
INVENTOR(S) : Yeow Meng Teo

Page 1 of 1

It is certified that error appears in the above-identified patent and that said Letters Patent is hereby corrected as shown below:

<u>Title page,</u>  
Item [54], the Title sould read  
-- METHOD FOR FORMING STACKED POLYSILICON CONTACTS --.

Signed and Sealed this

Sixteenth Day of April, 2002

*Attest:*

JAMES E. ROGAN  
*Attesting Officer*     *Director of the United States Patent and Trademark Office*